United States Patent [19]

Mukai

[11] Patent Number: 5,288,664
[45] Date of Patent: Feb. 22, 1994

[54] METHOD OF FORMING WIRING OF SEMICONDUCTOR DEVICE

[75] Inventor: Ryoichi Mukai, Kawasaki, Japan

[73] Assignee: Fujitsu Ltd., Kawasaki, Japan

[21] Appl. No.: 727,681

[22] Filed: Jul. 10, 1991

[30] Foreign Application Priority Data

Jul. 11, 1990 [JP] Japan .................. 2-182969
Sep. 19, 1990 [JP] Japan .................. 2-247458

[51] Int. Cl.$^5$ ......................................... H01L 21/268
[52] U.S. Cl. .................................. 437/173; 437/192;
437/194; 437/195; 437/228; 427/596
[58] Field of Search ............... 437/173, 174, 203, 194,
437/195, 249; 148/DIG. 93; 427/43.1, 53.1

[56] References Cited

U.S. PATENT DOCUMENTS

| | | | |
|---|---|---|---|
| 4,758,533 | 7/1988 | Magee et al. | 437/173 |
| 4,800,179 | 1/1989 | Mukai | 437/173 |
| 4,920,070 | 4/1990 | Mukai | 437/173 |
| 5,070,038 | 12/1991 | Jin | 437/203 |
| 5,087,589 | 2/1992 | Chapman et al. | 437/173 |
| 5,110,759 | 5/1992 | Mukai | 437/173 |

FOREIGN PATENT DOCUMENTS

| | | | |
|---|---|---|---|
| 0143445 | 6/1987 | Japan | 437/203 |
| 0273716 | 11/1987 | Japan | 437/203 |
| 63-44723 | 2/1988 | Japan | . |
| 63-213660 | 6/1988 | Japan | . |
| 0215055 | 9/1988 | Japan | 437/173 |
| 0287949 | 11/1989 | Japan | 437/203 |
| 0170420 | 7/1990 | Japan | 437/173 |

OTHER PUBLICATIONS

Moriya et al. "A Planar Metalization Process–Its Application to Tri-Level Aluminum Interconnection" Toshiba Research and Development Center, IEDM, pp. 550–553, 1988.

Primary Examiner—Olik Chaudhuri
Assistant Examiner—Richard A. Booth
Attorney, Agent, or Firm—Armstrong, Westerman, Hattori, McLeland & Naughton

[57] ABSTRACT

A method of forming a wiring (a multilayer interconnection) of a semiconductor device, comprising the steps of: forming a first conductor film on a first insulating film formed on a semiconductor substrate; forming a second insulating film having a via-hole on the first conductor film and first insulating film; depositing a second conductor film over the second insulating film and the via-hole; selectively etching the second conductor film to form a groove which surrounds the via-hole at a predetermined distance from the via-hole; irradiating the whole surface with a laser beam to melt and make the portion of the second conductor film from the edge of the via-hole to the groove flow into the via-hole, so that a conductor plug is formed within the via-hole; and forming a third conductor film in contact with the conductor plug. The other portion of the second conductor film prevents the laser beam from penetrating the first conductor film. The plug formation process is applied during a formation of other wiring (an electrode coming into contact with a doped region in a semiconductor substrate).

23 Claims, 8 Drawing Sheets

THICKNESS OA ALUMINUM FILM
COATED WITH 10nm THICK Ti

METHOD OF FORMING WIRING OF SEMICONDUCTOR DEVICE

BACKGROUND OF THE INVENTION

1. Field of the Invention

The present invention relates to a method of producing a semiconductor device, such as an IC and LSI, and more particularly, to a method of forming a wiring of the semiconductor device, which method comprises a step of filling a via-hole (i.e., through hole, or contact hole) formed in an insulating film with a conductor (metal) plug. In the present specification, the term "wiring" means an interconnection comprising conductor patterned films and a conductor plug connecting same to form an electric circuit of the semiconductor device.

2. Description of the Related Art

Recently, a higher degree of integration of a semiconductor device and device miniaturization have lead to a need to make a size of a contact hole for interconnecting lower and upper conductor patterned films smaller. When the upper conductor film is deposited by a conventional deposition method, such as a vacuum vapor deposition method or a sputtering method, the deposited film causes a step coverage problem at the edge of the contact hole, since an amount of a conductor (metal) adhering to a side wall of the contact hole is reduced by a shadow effect. This problem can be solved by filling the contact hole with a conductor (metal) plug.

As a method of filling the contact hole with a conductor plug (i.e., a method of forming a conductor plug in the contact hole), an attempt has been made to melt a conductor (metal) film placed around the contact hole by using heat generated by a laser beam irradiation, to cause the film to flow into the contact hole. For example, the wiring of a semiconductor device is formed by using the laser irradiation technique in the following manner (cf. FIGS. 1a to 1f).

Referring to FIG. 1a, a semiconductor (silicon) substrate 1 is prepared and is selectively and thermally oxidized to form a field oxide (SiO₂) film 2 on the substrate 1. Note, an unoxidized portion is not shown in FIG. 1a. Another insulating film 3 can be formed on the oxide film 2 by depositing an insulator (e.g., SiO₂) in accordance with a chemical vapor deposition (CVD) process, and these insulating films form a field insulation film. Then, a lower conductor film 4 is formed over the insulating film 3 by depositing a conductive material (e.g., Al) by, e.g., a sputtering process, and the conductor film 4 is patterned in accordance with a circuit design by a suitable photolithography technique. Another insulating film 5 is formed on the conductor pattern film 4 and the insulating film 3, by depositing an insulator (e.g., PSG) in accordance with a CVD process. Note, in the present specification, the term "Al" means aluminum and alloys thereof (e.g., Al-Cu, Al-Si, Al-Si-Cu or the like).

As shown in FIG. 1b, the insulating film 5 is selectively etched by a photolithography technique using, e.g., a reactive ion-etching (RIE) process, to form a via-hole (i.e., a contact hole) 6 with the result that a portion of the lower conductor film 4 is exposed in the via-hole 6.

As shown in FIG. 1c, a conductor material (e.g., Al) is then deposited over the insulating film 5 and the via-hole 6 by, e.g., a sputtering process, to form a conductor film 7.

As shown in FIG. 1d, the conductor film 7 is then selectively etched by a suitable photolithography technique using, e.g., RIE, to leave a portion thereof within and near the via-hole 6. Namely, the via-hole 6 is filled with an amount of the conductor portion 7, and a portion of the insulating film 5 not covered by the film 7 is exposed.

The conductor pattern film 7 is melted with a laser irradiation, so that the melt 8 on the insulating film 5 flows into the via-hole 6. As the result, as shown in FIG. 1e, the via-hole 6 is filled with the conductor melt 8 consisting of the flowed melt and a present melt. The conductor melt 8 is rapidly cooled and solidified immediately after the laser irradiation is stopped, to this form a conductor plug 8.

Thereafter, as shown in FIG. 1f, another conductor (e.g., Al) is deposited over the insulating film 5 and the conductor plug 8 by, e.g., a sputtering process, to form an upper conductor film 9 coming into contact with the plug 8. The film 9 is patterned in accordance with a circuit design, by a suitable photolithography technique using, e.g., RIE, with the result that a wiring (interconnection) structure is obtained.

Another wiring of a semiconductor device is formed by using the laser irradiation technique in the following manner (cf. FIGS. 2a to 2c).

As shown in FIG. 2a, a semiconductor (silicon) substrate (wafer) 11 is prepared and is selectively and thermally oxidized to form an oxide (SiO₂) film 12 on the substrate 11. Impurities (donor or acceptor) are selectively doped (introduced) into the substrate 11 by, e.g., an ion-implantation method, to form an impurity doped region (e.g., source region, drain region or base region) 13. A thin oxide (SiO₂) film 14 is formed on the doped region 13, by a thermal oxidation method, and an insulating film 15 is formed over the oxide films 12 and 14 by depositing an insulator (e.g., PSG) by a CVD process. These oxide films and insulating film form a field insulation film 16. Then, the insulation film 16 (in this case, the insulating film 15 and the thin oxide film 14) is selectively etched by a photolithography technique using, e.g., a RIE process, to form a via-hole (i.e., a contact hole) 17 in which a portion of the doped region 13 is exposed. A conductor material (e.g., Al) is deposited over the insulating film 15 and the via-hole 17 by, e.g., a sputtering process, to form a conductor film, and thereafter, the conductor film is patterned by a photolithography technique to leave a conductor portion 18 within the via-hole 17 and on an insulating film portion surrounding the via-hole 17. The amount of the conductor film portion remaining on the insulating film portion is sufficient to fill the via-hole 17.

As shown in FIG. 2b, the conductor portion 18 is melted with a laser irradiation, to make the melt of the conductor portion 18 on the insulating film 15 flow into the via-hole 17 and combine the flowing melt with the melt of the conductor film portion within the via-hole 17, with the result that a conductor plug 19 is formed to thus fill the via-hole 17.

Thereafter, as shown in FIG. 2c, another conductor (e.g., Al) is deposited over the insulating film 15 and the conductor plug by, e.g., a sputtering process, to form another conductor film 20 coming into contact with the plug 19. The film 20 is patterned in accordance with a circuit design by a suitable photolithography technique using, e.g., RIE, with the result that a wiring (interconnection) structure is obtained.

The above-mentioned laser beam irradiation technique successfully fills a via-hole with a conductor plug, but has the following disadvantages.

In the former case shown in FIGS. 1a to 1f, since a portion (a relatively large area) of the insulating film 5 is not covered with the upper conductor pattern film 7, and the insulating film 5 is made of a material transparent (e.g., $SiO_2$, PSG or the like) to a laser beam, the laser beam falls on the lower conductor pattern film 4 through the insulating film 5 and may melt the film 4, and as a result, a portion of the film 4 is destroyed and the predetermined circuit is damaged. In the latter case shown in FIGS. 2a to 2c, since a portion (a relatively large area) of the insulating film 15 is not covered by the conductor portion 18 and the insulation film 16 (insulating films 12, 14 and 15) is made of a material transparent (e.g., $SiO_2$, PSG or the like) to a laser beam, the laser beam falls on and into the substrate 11 through the insulation film 16. When a PN junction interface between the doped region 13 and the semiconductor substrate 11 is irradiated with the laser beam, crystal defects (indicated with "x" in FIG. 2b) are generated at the junction, which increases a leakage current at the PN junction.

To eliminate these disadvantages, a person with normal skill in the art may think that an Al film can be formed over the whole surface and then irradiated with a laser beam, to thus fill a via-hole with an Al plug and intercept the laser beam. Nevertheless, it is impossible to control an amount of the Al melt flowing into the via-hole, and thus although some via-holes are suitably filled, other via-holes are insufficiently or excessively filled.

SUMMARY OF THE INVENTION

An object of the present invention is to provide a method of filling a via-hole with a conductor plug by using a laser beam irradiation technique, without the above-mentioned problems.

Another object of the present invention is to provide an improved method of forming a wiring of a semiconductor device.

The above-mentioned and other objects of the present invention are attained by providing a method of forming a wiring of a semiconductor device, comprising the steps of: forming a first conductor film on a first insulating film formed on a semiconductor substrate; forming a second insulating film having a via-hole on the first conductor film and first insulating film; depositing a second conductor film over the second insulating film and the via-hole; forming a groove which surrounds the via-hole at a predetermined distance from the via-hole, in the second conductor film, by a selective etching process; irradiating the whole surface with a laser beam to make the portion of the second conductor film from the edge of the via-hole to the groove flow into the via-hole, so that a conductor plug is formed within the via-hole; and forming a third conductor film in contact with the conductor plug.

It is preferable to remove the second conductor film remaining on the second insulating film, prior to the third conductor formation step. The remaining conductor film is also melted by the laser irradiation and coheres at many locations of the second insulating film.

The third conductor formation step can be performed by depositing a conductor material over the whole surface, to cover the second conductor film remaining on the second insulating film, and selectively etching the conductor material and second conductor film.

The conductor plug in the via-hole can be made of a metal selected from the group consisting of Al (aluminum and alloys thereof), copper, gold, tungsten, molybdenum and platinum, which is a material of the second conductor film. It is preferable to use an aluminum film coated with a thin titanium film as the second conductor film. The aluminum has a high reflectivity (about 95%) to a laser beam, and thus a very high energy is needed to melt the aluminum film. When the titanium having a reflectivity of 38% is used for the coating on the aluminum film, the energy needed for melting the titanium coated aluminum film is less than that needed for melting the aluminum film.

The groove completely surrounds the via-hole, to thereby separate the portion of the second conductor film from the other portions thereof; this portion being in an amount sufficient to fill the via-hole together with a portion of the second conductor film deposited in the via-hole. If the thickness of the second conductor film is too thin, an area of the second conductor film portion becomes large and a part thereof coheres to the second insulating film and does not flow into the via-hole. Furthermore, a portion of the second conductor film may be evaporated by a high irradiating laser beam energy. If the thickness of the second conductor film is too thick, the energy necessary to melt the conductor film becomes large and a deposition profile over the via-hole becomes unsuitable. A suitable thickness (0.1 to 0.6 $\mu$m) of the second conductor film is obtained in accordance with the volume (diameter and depth) of the via-hole.

The groove has a width of from 0.3 to 1 $\mu$m (preferably, from 0.5 to 0.8 $\mu$m), since the lower limit depends on a minimum space attained by a suitable etching in accordance with a fine lithography technique, and the upper limit is determined to prevent the disadvantages caused by a laser beam passing through the groove. When the conductor (metal) is melted, the melt has a low wettability to an insulating material an thus is easily cohered to the insulating film. Thus, the groove (space) prevents a merging of the melt for the plug and the other melt of the other portions of the second conductor film.

Preferably, the laser beam has a size corresponding to a size of a semiconductor chip of the semiconductor device, so that a one pulse shoot of the laser beam can achieve the melting and plug formation.

It is possible to apply the present invention to other wiring which has an doped region formed in a semiconductor substrate instead of the first conductor film.

According to a second embodiment of the present invention, another wiring structure has a doped region formed in a semiconductor substrate, instead of the first conductor film of the above-mentioned wiring, and a via-hole of an insulating film is filled with a conductor plug for interconnecting the doped region and a third conductor film formed on the insulating film by a laser irradiation, in the same manner as above-mentioned.

According to a third embodiment of the present invention, when a laser beam irradiation is performed, a mask having a transparent portion corresponding to a portion of the second conductor film surrounding the via-hole is used to make the laser beam fall on the surrounding portion, and to intercept the beam so that it does not follow other portions of the second conductor film remaining on the second insulating film. It is preferable to remove the other portions of the second conductor film by a selective etching step when forming a groove surrounding the via-hole, since an additional step of removing the other portion can be thus omitted. Since a mask is used, the laser irradiation step can be performed by scanning the laser beam.

BRIEF DESCRIPTION OF THE DRAWINGS

The present invention will be more apparent from the description of the preferred embodiments set forth below, with reference to the accompanying drawings, in which:

FIG. 3b is a schematic plan view of the semiconductor device of FIG. 3a;

FIG. 5b is a schematic plan view of the semiconductor device of FIG. 5a;

DESCRIPTION OF THE PREFERRED EMBODIMENTS

Figure 1A:
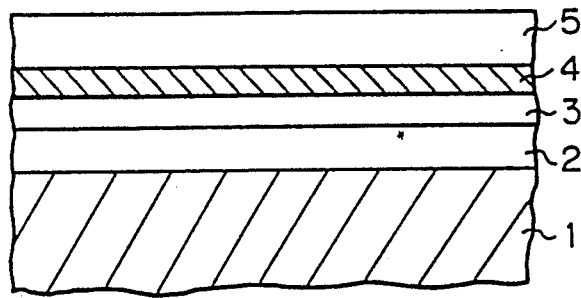
FIGS. 1a to 1f are schematic sectional views of a semiconductor device in various stages of a conventional producing process.
Figure 1B:
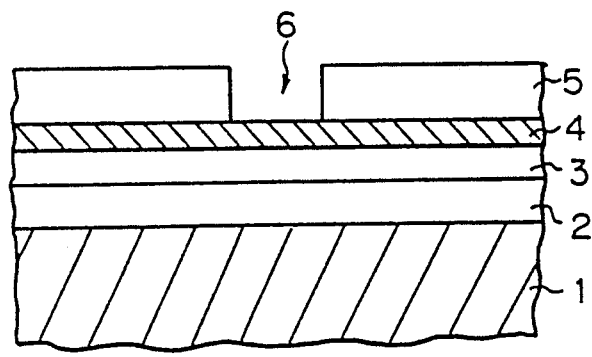
Figure 1C:
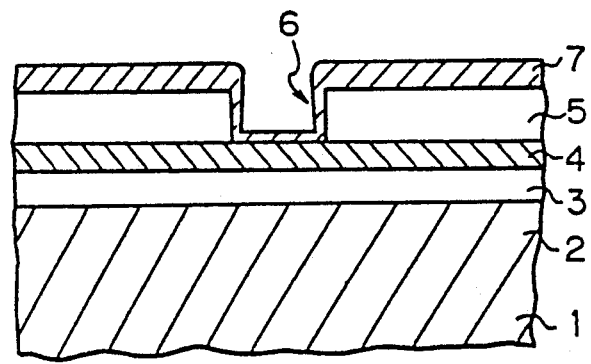
Figure 1D:
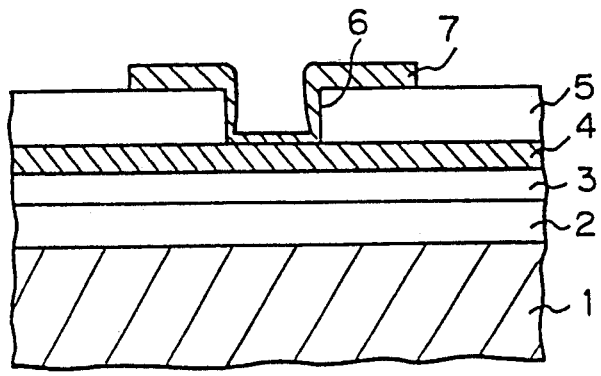
Figure 1E:
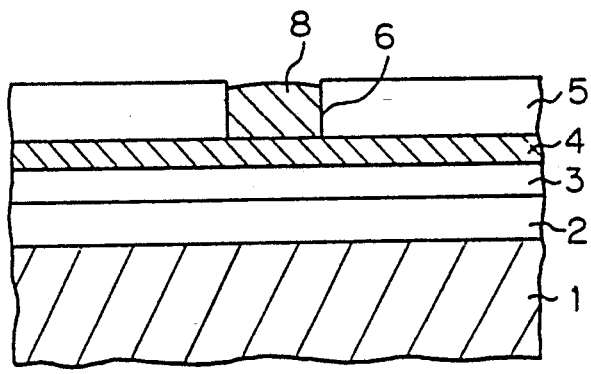
Figure 1F:
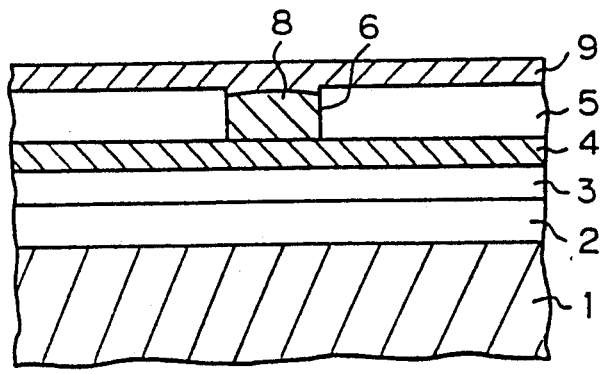

Referring to FIGS. 1a to 1c, 1e and 1f, and 3a to 3c, a wiring (a multilayer wiring structure) of a semiconductor device (e.g., a MOS IC or a bipolar transistor IC) is formed in accordance with a first embodiment of the present invention as follows:

In this case, the wiring to be formed is the same as that shown in FIG. 1f. As shown in FIG. 1a, a semiconductor (silicon) substrate 1 is prepared and is selectively and thermally oxidized to form a field oxide ($SiO_2$) film 2 having a thickness of, e.g., 600 nm, on the substrate 1. Another insulating film 3 (having a thickness of, e.g., 500 nm) is formed on the oxide film 2 by depositing an insulator (e.g., $SiO_2$) in accordance with a chemical vapor deposition (CVD) process. These insulating films 2 and 3 constitute a field insulation film. Then, a lower conductor film (having a thickness of, e.g., 500 nm) 4 is formed over the insulating film 3 by depositing aluminum by, e.g., a sputtering process, and the aluminum film 4 is patterned in accordance with a circuit design by a suitable photolithography technique. On the aluminum pattern film (having a line width of, e.g., 500 nm) 4 and the insulating film 3, another insulating film 5 (having a thickness of, e.g., 700 nm) is formed by depositing an insulator (e.g., PSG) in accordance with a CVD process.

As shown in FIG. 1b, the insulating film 5 is selectively etched by a photolithography technique using, e.g., a RIE process, to form a via-hole 6 (having a diameter of, e.g., 700 nm), with the result that a portion of the aluminum film 4 is exposed in the via-hole 6.

As shown in FIG. 1c, aluminum is deposited over the insulating film 5 and the via-hole 6 by, e.g., a sputtering process, to form an aluminum film 7 (having a thickness of, e.g., 200 nm) Then, the aluminum film 7 is coated with a titanium thin film (having a thickness of, e.g., 10 nm) by a sputtering process. In this case, the Ti coated aluminum film is also indicated by the reference numeral "7".

Figure 3A:
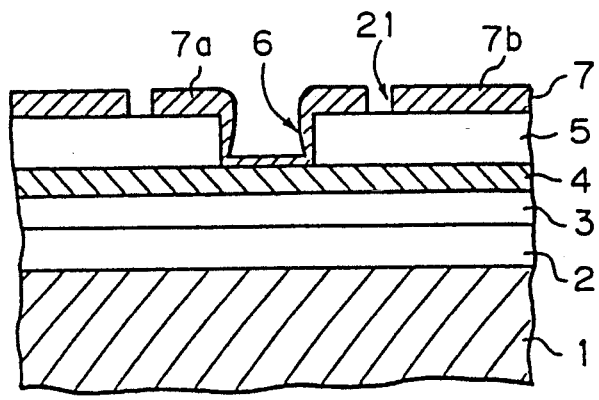
FIG. 3a is a schematic sectional view of a semiconductor device before a laser irradiation step in accordance with a first embodiment of the present invention.
Figure 3B:
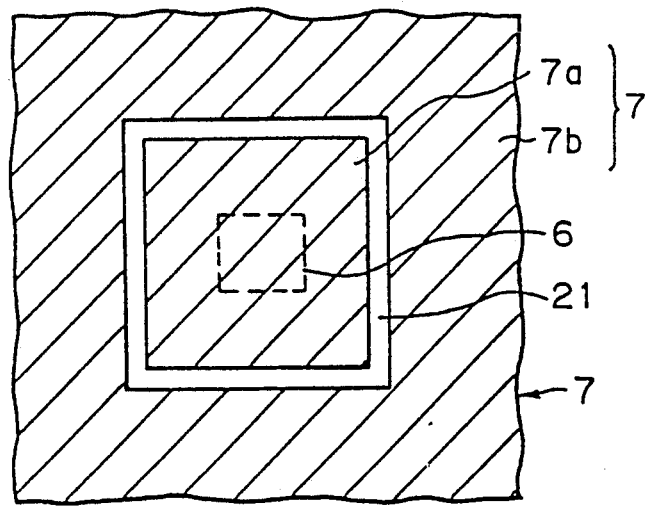

According to the present invention, as shown in FIGS. 3a and 3b, the Ti coated aluminum film 7 is selectively etched by a plasma RIE process using an etching gas (e.g., $CCl_4$ gas) to form a groove 21 having a width of, e.g., 2 μm, and surrounding the via-hole 6 at a distance of, e.g., 1.4 μm, from the via-hole edge. Such a distance is determined by a calculation of a volume of the film 7 necessary for filling the via-hole 6. In this case, the groove 21 has a square ring shape (FIG. 3b) but it can have a circular ring shape (not shown). Thus, the Ti coated aluminum film 7 is divided into a portion 7a in and near the via-hole 6, and another portion 7b.

Figure 3C:
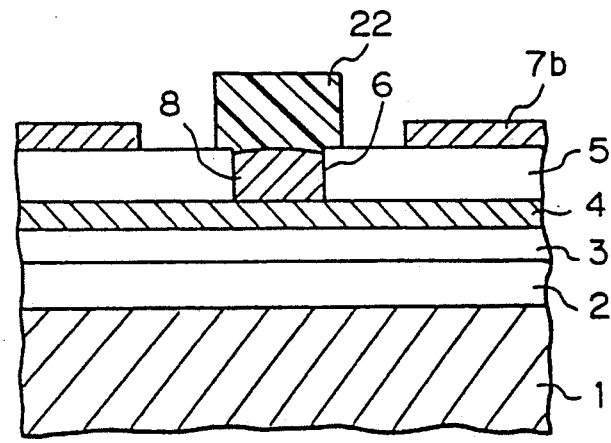
FIG. 3c is a schematic plan view of the semiconductor device after a laser irradiation step in accordance with the first embodiment of the present invention.

Next, the obtained semiconductor device (the whole of the Ti coated aluminum film 7 and the exposed insulating film 5 in the groove 21) is irradiated with a laser beam (having an energy density of, e.g., 0.6 $J/cm^2$) of a pulsed laser (e.g., an XeCl excimer laser having a wavelength of 308 nm), with a laser beam spot corresponding to a size of the semiconductor device chip and being, e.g., 20 mm long and 20 mm wide. As a result of the laser irradiation, the Ti coated aluminum film 7 is melted, and the melt of the portion 7a thereof surrounding the via-hole 6 flows into the via-hole 6, as shown in FIG. 3c, to fill some, and the melt of the other portion 7b coheres thereto at certain locations thereof. An irradiation time (pulse period) of the laser beam being, e.g., several tenths of a nanosecond, is shorter than a time from a start of melting to a finish of flowing, which is about 100 nanoseconds. If the irradiation time becomes longer, the laser beam falls on the lower aluminum pattern film 4 after the shift of the latter melt, and the melt in the via-hole 6 is overheated to cause an unfavorable reaction. The melt 8 filling the via-hole 6 is rapidly cooled and solidified to form a metal (Al-Ti alloy) plug 8.

After the laser irradiation treatment, a resist is applied on the whole surface, and exposed and developed to form a resist mask 22 covering the plug 8, as shown in FIG. 3c. The Al-Ti alloy cohered parts remaining on the insulating film 5 are removed by an etching process (e.g., a plasma RIE process), and then the resist mask 22 is removed. As a result, the via-hole 6 is filled with the metal plug 8 as shown in FIG. 1e.

Thereafter, as shown in FIG. 1f, aluminum is deposited over the insulating film 5 and the metal plug 8 by, e.g., a sputtering process, to form an upper aluminum film 9 having a thickness of, e.g., 1 μm, and coming into contact with the plug 8. The film 9 is patterned in accordance with a circuit design by a suitable photolithography technique using, e.g., RIE, with the result that a wiring (interconnection) structure is obtained.

As mentioned above, at the laser irradiation step, the other portion of the Ti coated aluminum film on the insulating film prevents the laser beam from reaching the lower aluminum pattern film, and thus a breakdown of the lower film and damage to the circuit do not occur.

Figure 4:
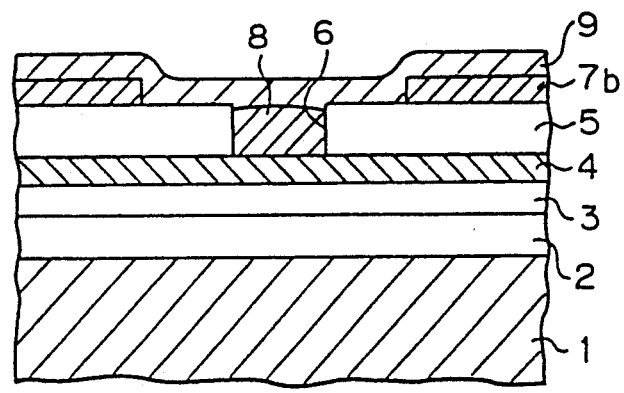
FIG. 4 is a schematic sectional view of a semiconductor device at a step of forming an upper conductor film without a removal of a remaining conductor portion.

It is possible to omit the step of removing the other portion 7b of the TI coated aluminum film 7 from the surface of the insulating film, and in such a case, after the laser irradiation step as shown in FIG. 4, the aluminum film 9 is formed on the whole surface, and the films 9 and 7b are simultaneously patterned by a RIE process, whereby a wiring is also obtained.

Figure 2A:
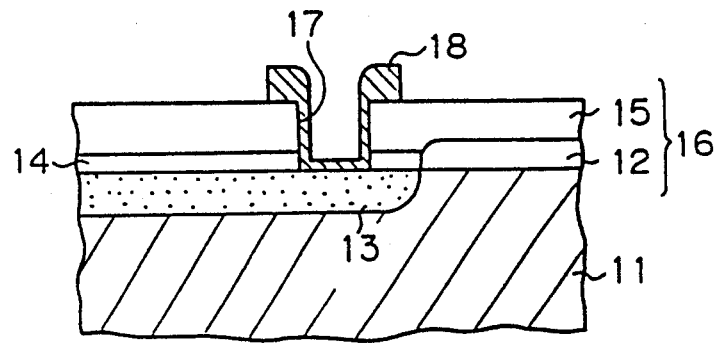
FIGS. 2a to 2c are schematic sectional views of another semiconductor device in various stages of another conventional producing process.
Figure 2B:
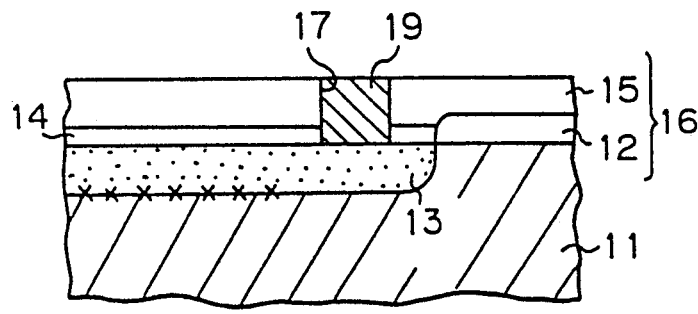
Figure 2C:
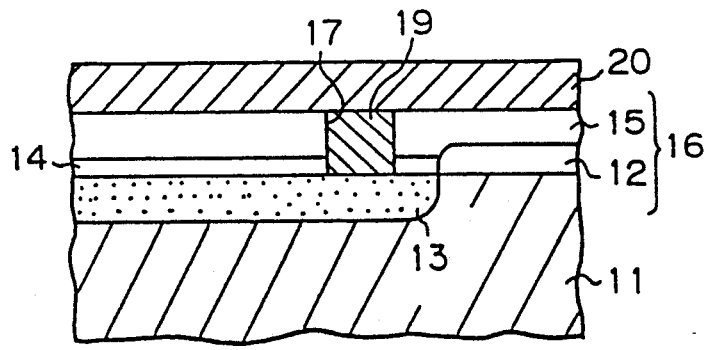
Figure 5A:
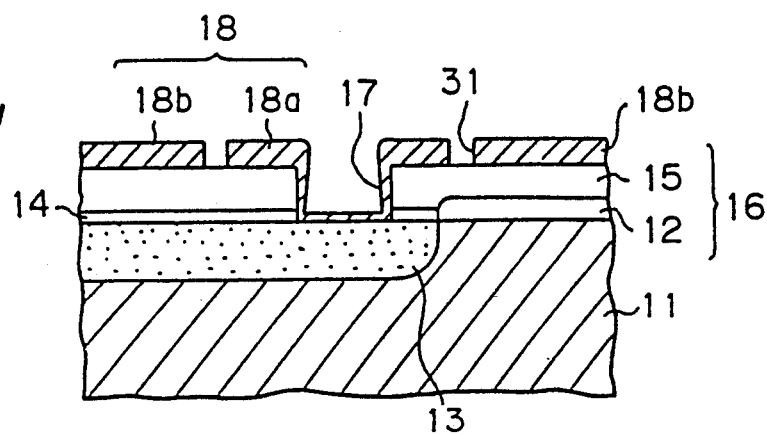
FIG. 5a is a schematic sectional view of a semiconductor device before a laser irradiation step in accordance with a second embodiment of the present invention.
Figure 5B:
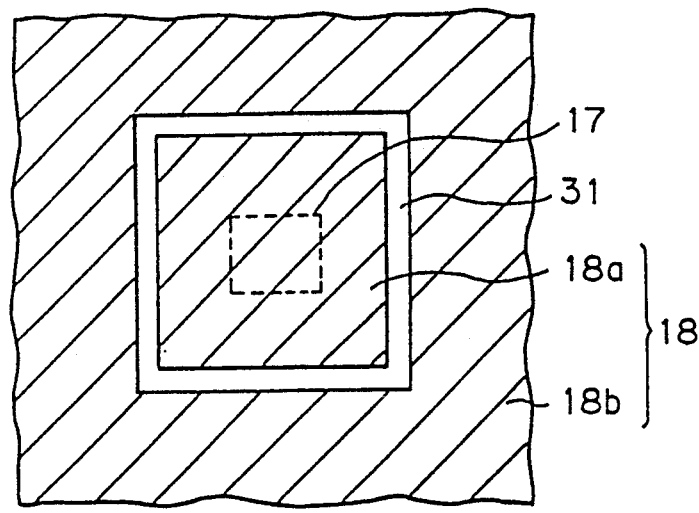

Referring to FIGS. 5a, 5b, 5c, 2b and 2c, a wiring (an electrode in contact with a doped region) of a semiconductor device (e.g., a MOS IC or a bipolar transistor IC) is formed in accordance with a second embodiment of the present invention as follows:

In this case, the wiring to be formed is the same as that shown in FIG. 2c. As shown in FIGS. 5a and 5b, a semiconductor (silicon) substrate (wafer) 11 is prepared and is selectively and thermally oxidized to form an oxide ($SiO_2$) film 12 on the substrate 11, and impurities (e.g., As) are selectively doped (introduced) into the substrate 11 by an ion-implantation method to form an impurity doped region (e.g., source region, drain region or base region) 13. A thin oxide ($SiO_2$) film 14 (having a thickness of 25 nm) is formed on the doped region 13, by a thermal oxidation method, and an insulating film 15 (having a thickness of 500 nm) is formed over the oxide films 12 and 14 by depositing an insulator (e.g., PSG) by a CVD process. These oxide films and insulating film constitute a field insulation film 16. Then, the insulation film 16 (in this case, the PSG film 15 and the thin $SiO_2$ film 14) is selectively etched by a photolithography technique using, e.g., a RIE process, to form a via-hole 17 (having a diameter of, e.g., 700 nm), in which a portion of the doped region 13 is exposed. Aluminum is deposited over the insulating film 15 and the via-hole 17 by, e.g., a sputtering process, to form an aluminum film 18 (having a thickness of, e.g., 200 nm). Then, the aluminum film 18 is coated with a titanium thin film (having a thickness of, e.g., 10 nm) by a sputtering process. In this case, the Ti coated aluminum film is also indicated by the reference numeral "18". Thereafter, according to the present invention, the Ti coated aluminum film 18 is selectively etched by a plasma RIE process using an etching gas (e.g., $CCl_4$ gas) to form a groove 31 having a width of, e.g., 2 μm, and surrounding the via-hole 17 at a distance of, e.g., 1.4 μm, from the via-hole edge (in FIGS. 5a and 5b). Thus, the film 18 is divided into a portion 18a within and near the via-hole 17, and the other portion 18b.

Figure 5C:
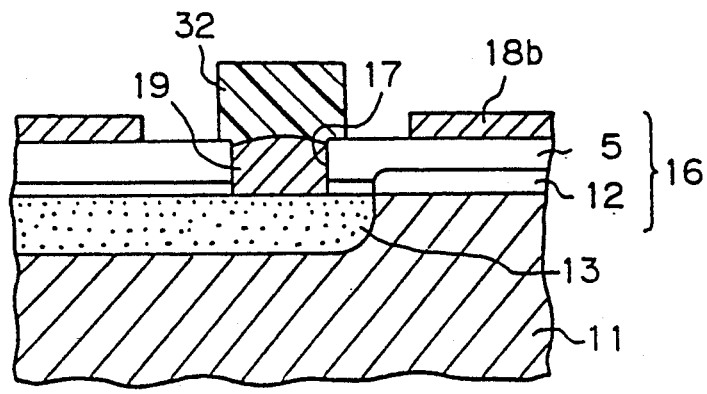
FIG. 5c is a schematic plan view of the semiconductor device after a laser irradiation step in accordance with the second embodiment of the present invention.

Next, the obtained semiconductor device (the whole of the Ti coated aluminum film 18 and the exposed insulating film 15 in the groove 31) is irradiated with a laser beam (having an energy density of, e.g., 0.6 $J/cm^2$) of a pulsed laser (e.g., a KrF excimer laser having a wavelength of 238 nm, by a laser beam spot corresponding to a size of the semiconductor device chip and being, e.g., 20 mm long and 20 mm wide. As a result of the laser irradiation, the Ti coated aluminum film 18 is melted, and the melt of the portion 18a flows into the via-hole 17, as shown in FIG. 5c, to fill same, and the melt of the other portion 18b is coheres thereto at certain locations thereof. The melt 19 filling the via-hole 17 is rapidly cooled and solidified to form a metal (Al-Ti alloy) plug 19.

After the laser irradiation treatment, a resist is applied on the whole surface, and exposed and developed to form a resist mask 32 covering the plug 19, as shown in FIG. 5c. The Al-Ti alloy cohered parts of the other portion 18b remaining on the insulating film 15 are removed by an etching process (e.g., a plasma RIE process), and then the resist mask 32 is removed, and as a result, the via-hole 6 is filled with the metal plug 19, as shown in FIG. 2b. Note that, at the laser irradiation step, the other portion of the Ti coated aluminum film on the insulating film prevents the laser beam from penetrating the silicon substrate 11, and thus crystal defects are not formed at the PN junction at the bottom of the doped region.

Thereafter, as shown in FIG. 2c, aluminum is deposited over the insulating film 15 and the metal plug 19 by, e.g., a sputtering process, to form an aluminum film 20 having a thickness of, e.g., 1 μm, and coming into contact with the plug 19. The film 20 is patterned in accordance with a circuit design by a suitable photolithography technique using, e.g., RIE, with the result that a wiring (electrode) structure is obtained.

Figure 6:
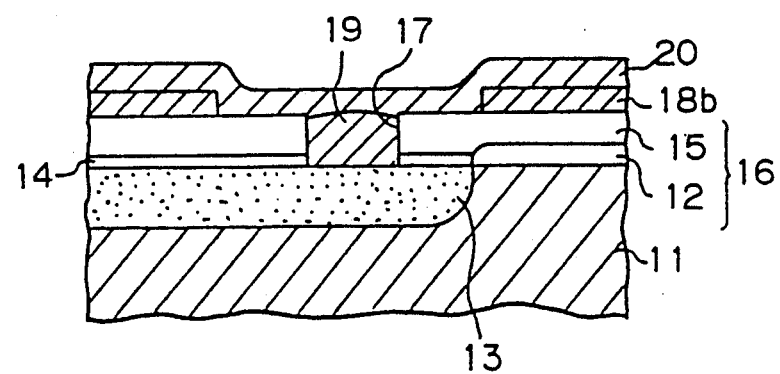
FIG. 6 is a schematic sectional view of a semiconductor device at a step of forming an upper conductor film without a removal of a remaining conductor portion.

It is possible to omit the step of removing the other portion 18b of the TI coated aluminum film 18 from the surface of the insulating film, and in such a case, after the laser irradiation step as shown in FIG. 6, the aluminum film 20 is formed on the whole surface and the films 20 and 18b are simultaneously patterned by a RIE process, whereby a wiring is also obtained.

Figure 7:
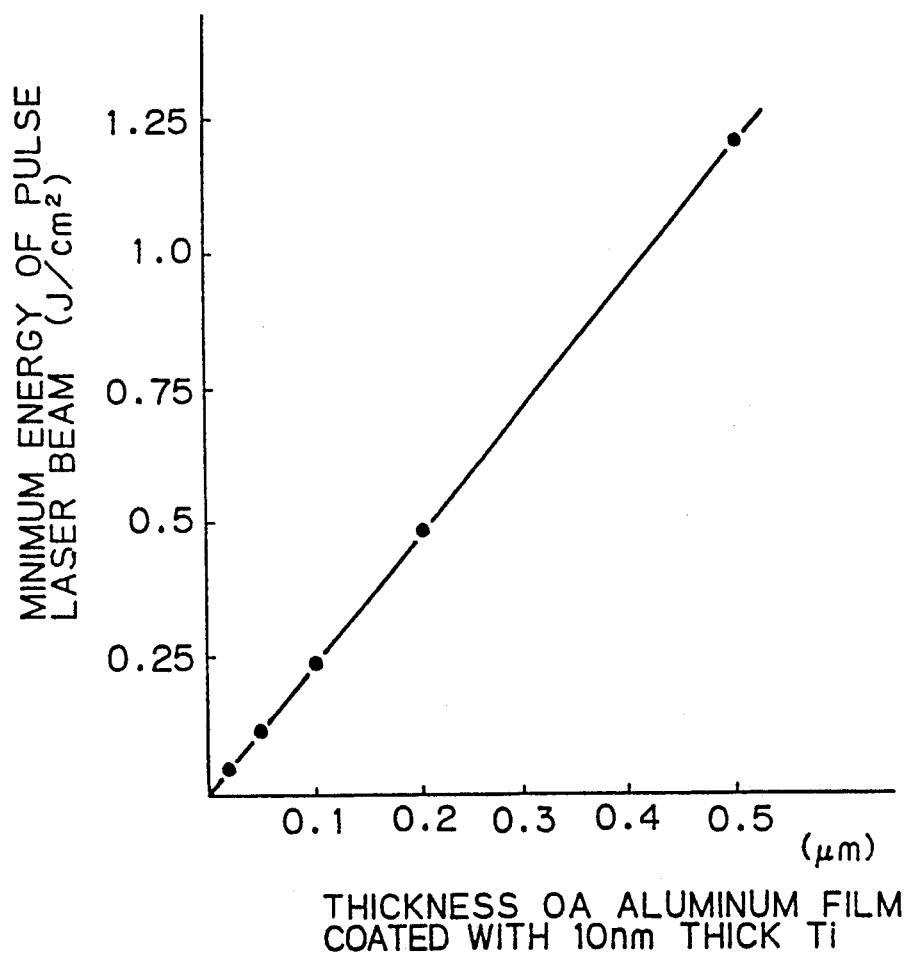
FIG. 7 is a graph showing a relationship between a Ti coated aluminum film thickness and a minimum energy of pulse laser beam for melting the film.

The minimum energy of a pulse laser beam for melting aluminum is proportional to a thickness of a Ti coated aluminum film, and according to the present inventor's experiments, a relationship between these factors is illustrated as shown in the graph of FIG. 7. In this case, each of aluminum films is coated with a thin Ti film having a thickness of 10 nm, and thus the minimum energy value is $2.4 \times 10^4$ $J/cm^2$; the thinner Ti coated aluminum film, the smaller the minimum energy value. Nevertheless, if the Ti coated aluminum film is too thin, the area thereof is increased and it does not all flow into the via-hole. Therefore, a suitable thickness of the film is determined, taking a power of a laser and the film area in account. Furthermore, a thickness of a conductor film and an energy density of a pulse laser beam for melting the film have the following relationship:

Energy density of laser ($J/cm^2$) > A × Conductor film thickness (cm) wherein "A" is from $1.5 \times 10^4$ to $3 \times 10^4$ $J/cm^3$.

The coefficient "A" depends on properties of the conductor film (reflectivity, absorbency, melting point or the like).

Figure 8A:
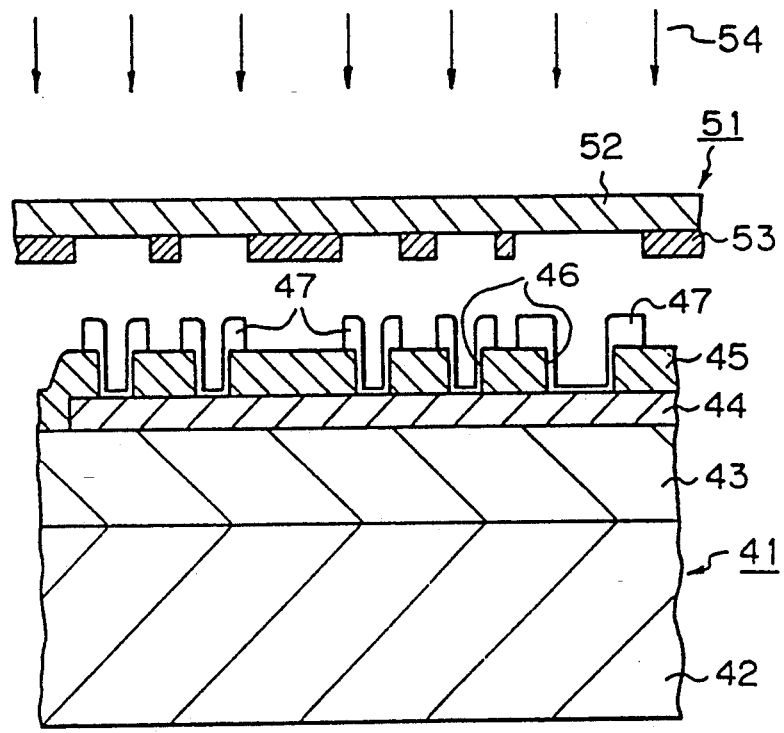
FIG. 8a is a schematic sectional view of a semiconductor device and a laser beam mask at a laser irradiation step in accordance with a third embodiment of the present invention.
Figure 8B:
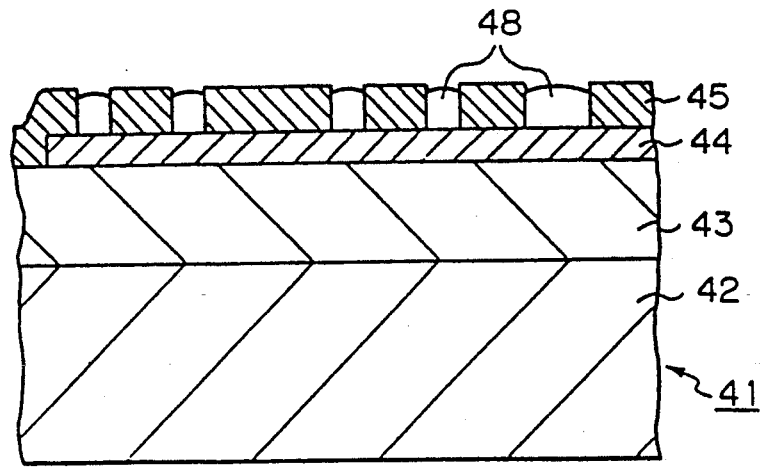
FIG. 8b is a schematic plan view of the semiconductor device after a laser irradiation step in accordance with the third embodiment of the present invention.

Referring to FIGS. 8a and 8b, a laser irradiation for filling via-holes with copper in accordance with a third embodiment of the present invention will be explained hereinafter.

As shown in FIG. 8a, an uncompleted semiconductor device 41 and a mask 51 having a transparent pattern are prepared. In the semiconductor device 41 corresponding to that shown in FIG. 1d, a first insulating film 43 is formed on a silicon substrate (wafer) 42, and then a lower conductor film (aluminum pattern film having a thickness of 0.5 μm and a line width of 1 μm) 44 is formed on the insulating film 43, in accordance with a conventional production process. Another insulating material (PSG) is deposited over the aluminum film 44 and the insulating film 43, to form a second insulating film 45 having a thickness of 1 μm. A photoresist is applied on the insulating film 44, exposed by using a photomask having a via-hole pattern, and developed to form a resist mask (not shown). Next, the second insulating film 45 is selectively etched by a suitable etching process (e.g., RIE process) to form via-holes 46 in which portions of the aluminum film 44 appear. Copper is deposited over the insulating film 45 and the via-holes 46 by a sputtering, to form a copper film 47 having a thickness of 0.5 μm. Another photoresist is applied on the copper film 47, exposed by using a photomask having a predetermined pattern, and developed to form a resist mask (not shown). Then, the copper film 47 is selectively etched by a suitable etching process (e.g., RIE process) to leave portions thereof within and near the via-holes 46. Namely, the other portion of the copper film 47 not covered with the resist mask is removed, as shown in FIG. 8. Each portion of the copper film 47 remaining on the insulating film 45 is in an amount sufficient to fill each of the via-holes 46. It is possible to form grooves surrounding the via-holes, respectively, in a manner similar that shown in FIGS. 3a and 3b, in the copper etching step.

On the other hand, the mask 51 comprises a quartz plate 52 transparent to a laser beam, and a metal (aluminum) is deposited on the whole surface of the quartz plate 52 to form an metal film 53 having a thickness of 2 μm. A photoresist is applied on the metal film 53, exposed by using a photomask having a predetermined pattern corresponding to that used in the copper film etching step, and developed to form a resist mask (not shown). Then, the metal film 53 is selectively etched by a suitable etching process (e.g., RIE process) to remove portions thereof corresponding to the remaining copper portions within and near the via-holes 46, so that the mask 51 has a transparent pattern corresponding to a pattern of the remaining copper portions 47.

The mask 51 is arranged to align the transparent pattern thereof with the copper portion pattern of the semiconductor device 41, as shown in FIG. 8, and the semiconductor device 41 is irradiated with a pulse laser beam 54 through the mask 51. The laser beam 54 passing through the transparent portion of the mask 51 falls on and melts the copper portions 47, and the melt flows into each of the via-holes 46 and is solidified to form copper plugs 48, as shown in FIG. 8b. Although the obtained structure corresponds to that shown in FIG. 1e, the metal pattern 53 of the mask 51 prevents the laser beam from reaching the aluminum pattern film 44, which thus prevents a breakdown of the film 44 and damage to the circuit.

Since the copper has a reflectivity of about 20% to a laser, and an absorptivity of about $0.9 \times 10^6$/cm at a light wavelength range of 190 to 350 nm, the copper portions 47 can be melted by a laser beam of a pulsed XeCl excimer laser having an energy density of 0.6 J/cm$^2$. Although the copper melting point (1084° C.) is higher than the aluminum melting point (660° C.), the energy density needed for melting the copper is smaller than that needed for melting the aluminum, since the copper absorbs more of the laser irradiation energy than does the aluminum. In the mask 51, since the aluminum pattern 53 is a relatively thick (2 μm thick) and has a high reflectivity, the aluminum pattern 53 cannot be melted.

It is possible to use a continuous wave laser instead of the pulsed laser. In this case, the laser beam of the continuous wave laser is scanned over the mask having a transparent pattern to fall on the copper portions only.

It will be obvious that the present invention is not restricted to the above-mentioned embodiments and that may variations are possible for persons skilled in the art without departing from the scope of the invention.

I claim:

1. A method of forming a wiring of a semiconductor device comprising the steps of:

forming a first conductor film on a first insulating film formed on a semiconductor substrate;

forming a second insulating film having a via-hole on said first conductor film and first insulating film;

depositing a second conductor film over said second insulating film and said via-hole;

selectively etching said second conductor film to form a groove which surrounds said via-hole at a predetermined distance from the via-hole and to leave the remaining portion thereof on said second insulating film;

irradiating the whole surface with a laser beam to make the portion of said second conductor film from the edge of said via-hole to said groove flow into said via-hole, so that a conductor plug is formed within said via-hole and forming a third conductor film in contact with said conductor plug.

2. A method according to claim 1, further comprising a step of removing other portions of said second conductor film remaining on said second insulating film, prior to said third conductor formation step.

3. A method according to claim 1, wherein said third conductor film formation step is performed by depositing a conductor material over the whole surface to cover said other portions of said second conductor film remaining on said second insulating film and selectively etching said conductor material and said second conductor film.

4. A method according to claim 1, wherein a metal selected from the group consisting of aluminum, copper, gold, tungsten, molybdenum and platinum is used as said second conductor film.

5. A method according to claim 1, wherein an aluminum film over-coated with a thin titanium film is used as said second conductor film.

6. A method according to claim 1, wherein said groove completely surrounds said via-hole, to thereby separate said portion of said second conductor film from said other portions thereof, said portion being present in an amount sufficient to fill said via-hole together with a portion of said second conductor film deposited in said via-hole.

7. A method according to claim 1, wherein said groove has a width of from 0.3 to 1 μm.

8. A method according to claim 1, wherein said groove has a width of from 0.5 to 0.8 μm.

9. A method according to claim 1, wherein said laser beam has a size corresponding to a size of a semiconductor chip of said semiconductor device.

10. A method of forming wiring of a semiconductor device, comprising the steps of:

forming a doped region in a semiconductor substrate;

forming a first insulating film having a via-hole in which a portion of said doped region is exposed, on said semiconductor substrate;

depositing a first conductor film over said first insulating film and said via-hole;

selectively etching said first conductor film to form a groove which surrounds said via-hole at predetermined distance from the via-hole and to leave the remaining portion thereof on said second insulating film;

irradiating the whole surface with a laser beam to make the portion of said first conductor film from the edge of said via-hole to said groove flow into said via-hole, so that a conductor plug is formed within said via-hole; and forming a second conductor film in contact with said conductor plug.

11. A method according to claim 10, further comprising a step of removing other portions of said first conductor film remaining on said first insulating film, prior to said second conductor formation step.

12. A method according to claim 10, wherein said second conductor film formation step is performed by depositing a conductor material over the whole surface to cover said other portions of said first conductor film remaining on said first insulating film and selectively etching said conductor material and first conductor film.

13. A method according to claim 10, wherein a metal selected from the group consisting of aluminum, copper, gold, tungsten, molybdenum and platinum is used as said first conductor film.

14. A method according to claim 10, wherein an aluminum film over-coated with a thin titanium film is used as said first conductor film.

15. A method according to claim 10, wherein said groove completely surrounds said via-hole, to thereby separate said portion of said second conductor film from the other portions thereof, said portion being present in an amount sufficient to fill said via-hole together with a portion of said second conductor film deposited in said via-hole.

16. A method according to claim 10, wherein said groove has a width of from 0.3 to 1 $\mu$m.

17. A method according to claim 10, wherein said laser beam has a size corresponding to a size of a semiconductor chip of said semiconductor device.

18. A method of forming wiring of a semiconductor device, comprising the steps of:

forming a first conductor film on a first insulating film formed on a semiconductor substrate;

forming a second insulating film having a via-hole on said first conductor film and first insulating film;

depositing a second conductor film over said second insulating film and said via-hole;

selectively etching said second conductor film to leave a portion thereof surrounding said via-hole and lying in said via-hole;

irradiating said portion of said second conductor film with a laser beam through a mask having a transparent portion corresponding to said portion to make said portion flow into said via-hole, so that a conductor plug is formed within said via-hole; and forming a third conductor film on said conductor plug and said second insulating film and in contact with said conductor plug.

19. A method according to claim 18, wherein a metal selected from the group consisting of aluminum, copper, gold, tungsten, molybdenum and platinum is used as said second conductor film.

20. A method according to claim 18, wherein an aluminum film over coated with a thin titanium film is used as said second conductor film.

21. A method according to claim 18, wherein said portion is present in an amount sufficient to fill said via-hole together with a portion of said second conductor film deposited in said via-hole.

22. A method according to claim 18, wherein said laser beam has a size corresponding to a size of a semiconductor chip of said semiconductor device.

23. A method according to claim 18, wherein at said laser irradiation step, said laser beam is scanned over said mask.

* * * * *